(12) United States Patent
Fernandez

(10) Patent No.: US 6,245,597 B1
(45) Date of Patent: Jun. 12, 2001

(54) METHOD FOR REDUCING DIE CRACKING IN INTEGRATED CIRCUITS

(75) Inventor: Joseph Fernandez, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/407,450

(22) Filed: Sep. 28, 1999

(51) Int. Cl.[7] ............................. H01L 21/44; H01L 23/28

(52) U.S. Cl. .................. 438/118; 438/112; 438/124; 257/683; 257/787

(58) Field of Search ........................... 438/111, 112, 438/118, 119, 123–127; 257/669, 683, 787, 788

(56) References Cited

U.S. PATENT DOCUMENTS

| 4,908,086 | * | 3/1990 | Goodrich et al. | 438/118 |
|---|---|---|---|---|
| 5,554,569 | * | 9/1996 | Ganesan et al. | 438/123 |
| 5,759,874 | * | 6/1998 | Okawa | 438/124 |
| 6,046,507 | * | 4/2000 | Hatchard et al. | 438/126 |
| 6,077,724 | * | 6/2000 | Chen | 438/123 |
| 6,091,157 | * | 7/2000 | Black et al. | 438/124 |
| 6,101,101 | * | 8/2000 | Tzu et al. | 438/123 |

* cited by examiner

Primary Examiner—Kevin M. Picardat
(74) Attorney, Agent, or Firm—Baker Botts L.L.P.

(57) ABSTRACT

The method which applies to plastic encapsulated integrated circuit packages comprises the steps of increasing the thickness of the epoxy adhesive that is used to couple an integrated circuit die to a mounting structure and reducing the thickness of the integrated circuit die. Each step may be taken independently or concurrently.

14 Claims, 1 Drawing Sheet

METHOD FOR REDUCING DIE CRACKING IN INTEGRATED CIRCUITS

BACKGROUND OF THE INVENTION

1. Field of the Invention

This invention relates generally to the assembly and packaging of integrated circuits for plastic encapsulation. Specifically, this invention is a method for fabricating and mounting an unencapsulated integrated circuit die to a mounting structure such as a metal die paddle that reduces the propensity of the integrated circuit die to crack or fracture when subject to thermal stress.

2. Description of the Prior Art

The current state of the art for plastic packaged integrated circuits describes an integrated circuit die coupled to a mounting structure by epoxy, glue or other types of adhesive material. The integrated circuit die and mounting structure are subsequently encapsulated in plastic material, typically through a transfer molding process.

The problem, noticed in the Joint Electron Device Engineering Council (JEDEC) semiconductor package identified as Thin Shrink Small Outline Package (TSSOP), but applicable to virtually all types of plastic encapsulation of integrated circuits, is cracking or fracturing of the integrated circuit die when subject to thermal stress. Thermal stress can, and often does occur, at temperatures above 25 deg. C. Under test and/or operating conditions, the thermal coefficient of expansion of the mounting structure and the die are very similar, but not identical. Thus, in the absence of plastic encapsulation the mounting structure and the die will illustrate similar expansion and contraction characteristics.

However, once the device is encapsulated in plastic, the thermal coefficient of expansion of the mounting structure is greater than that of the plastic encapsulant. The result of the plastic encapsulation is the presence of competing and opposite forces on the integrated circuit die. For example, as temperature increases, either by ambient variation or by operating heat dissipation, the plastic package tends to expand thus creating forces onto the integrated circuit die. These forces from the plastic package tend to inhibit the expansion of the die because there are expansion forces from the die itself which are opposite in direction to those of the plastic package. Also, there are expansion forces from the mounting structure which cause a frictional migratory effect on the interface between the die and the die paddle. Simply put, above 25 deg. C., expansion forces occur at two key interfaces as a result of thermal stress: 1) the integrated circuit die and plastic package interface, and 2) the integrated circuit die and mounting structure interface.

The result of these expansion forces typically appears initially as cracks on the bottom of the integrated circuit die, i.e., the surface of the integrated circuit die which interfaces with mounting structure. The cracks or fractures may then propagate throughout the die. Under lower stress conditions, the cracks may be observed on the bottom surface of the integrated circuit die as hairline fractures. These hairline fractures typically result in partial loss of function of the integrated circuit. In extreme cases, the cracks may have propagated throughout the entire thickness of the integrated circuit die to the extent of complete fissure of the die, resulting in loss of function and total failure of the integrated circuit.

Therefore, a need existed to provide a method for fabricating an integrated circuit die and attaching the integrated circuit die to a mounting structure for plastic encapsulated packages that reduces the propensity of die cracking.

SUMMARY OF THE INVENTION

It is an object of the present invention to provide a method which reduces integrated circuit die cracking in plastic encapsulated integrated circuit packages. The method comprises two steps each of which may be taken independently or concurrently. The first step is to provide a thicker epoxy adhesive layer, relative to the prior art, for coupling, attaching or bonding an integrated circuit die to a mounting structure such as a metal die paddle or to a metal layer deposited on a substrate. The second step is to provide an integrated circuit die with reduced die thickness, relative to the prior art.

According to one aspect of the invention, there is provided a method for reducing integrated circuit die cracking, comprising the steps of: coupling an integrated circuit die to a mounting structure by applying an epoxy adhesive to the mounting structure and attaching the integrated circuit die to the epoxy adhesive; and encapsulating the integrated circuit die, the epoxy adhesive and the mounting structure in plastic; wherein a die thickness of the integrated circuit die is approximately 0.0075–0.0085 inches and a thickness of the epoxy adhesive is approximately 0.0012–0.003 inches when applied.

According to a further aspect of the invention, there is provided a method for reducing integrated circuit die cracking, comprising the steps of: coupling an integrated circuit die to a mounting structure by applying an epoxy adhesive to the mounting structure and attaching the integrated circuit die to the epoxy adhesive; and encapsulating the integrated circuit die, the epoxy adhesive and the mounting structure in plastic; wherein a die thickness of the integrated circuit is approximately 0.0075–0.0085 inches and a thickness of the epoxy adhesive is approximately 0.0005–0.0025 inches after curing of the epoxy adhesive and encapsulation.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

The present invention is better understood by reading the following description of non-limitative embodiments with reference to the attached drawings wherein like parts in each of the several figures are identified by the same reference characters, and which are briefly described as follows.

It is to be noted, however, that the appended drawings illustrate only typical embodiments of this invention and are therefore not to be considered limiting of its scope, as the invention may admit to other equally effective embodiments.

DETAILED DESCRIPTION OF THE INVENTION

The present invention may be applied to two JEDEC families of plastic encapsulated integrated circuits. One such family is identified as Thin Plastic Encapsulated Integrated Circuits (Thin Packages) and includes TSSOP, Low Profile Quad Flat Package (LQFP), Thin Quad Flat Package (TQFP), Thin Shrink Outline Package (TSQP) and Very Small Outline Package (VSOP). Another such family is identified as Standard Plastic Encapsulation Integrated Circuits (Standard Packages) which includes Plastic Dual In Line Package (PDIP), Plastic Leaded Chip Carrier (PLCC), Plastic Quad Flat Package (PQFP), Small Outline Integrated Circuit Package (SOIC), Quartered Small Outline Package (SOP), Shrink Small Outline Package (SCOP) and Plastic Ball Grid Array (PBGA).

Figure 1:
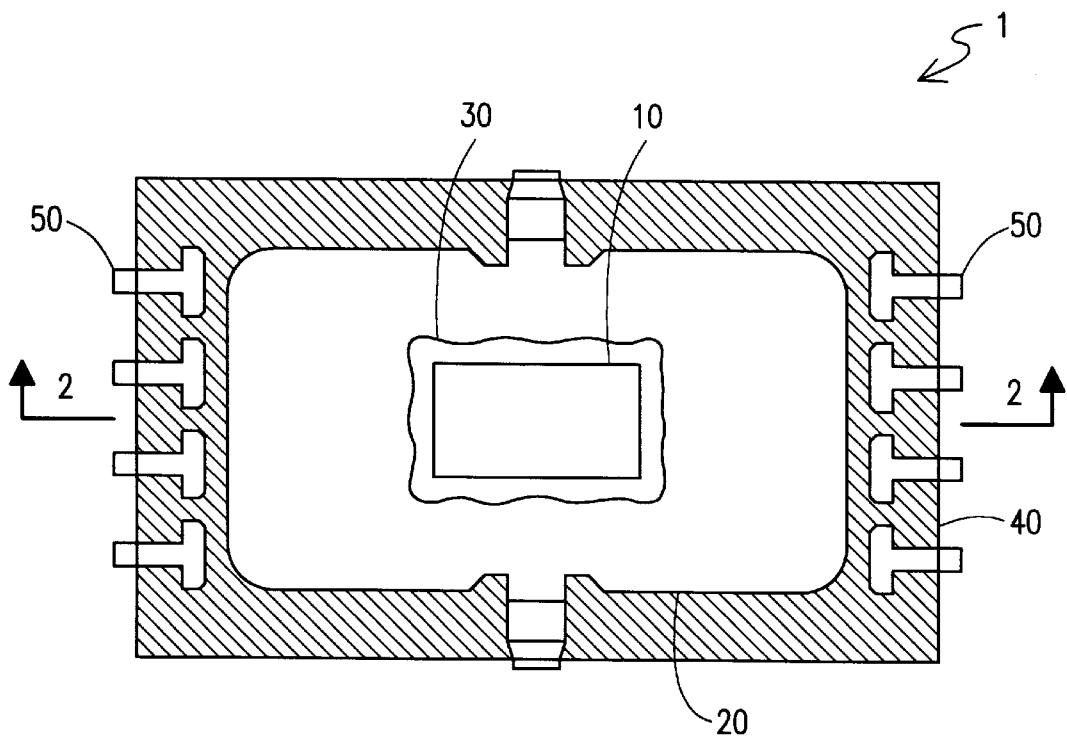
FIG. 1 is a top cross-section view of a plastic encapsulated integrated circuit.
Figure 2:
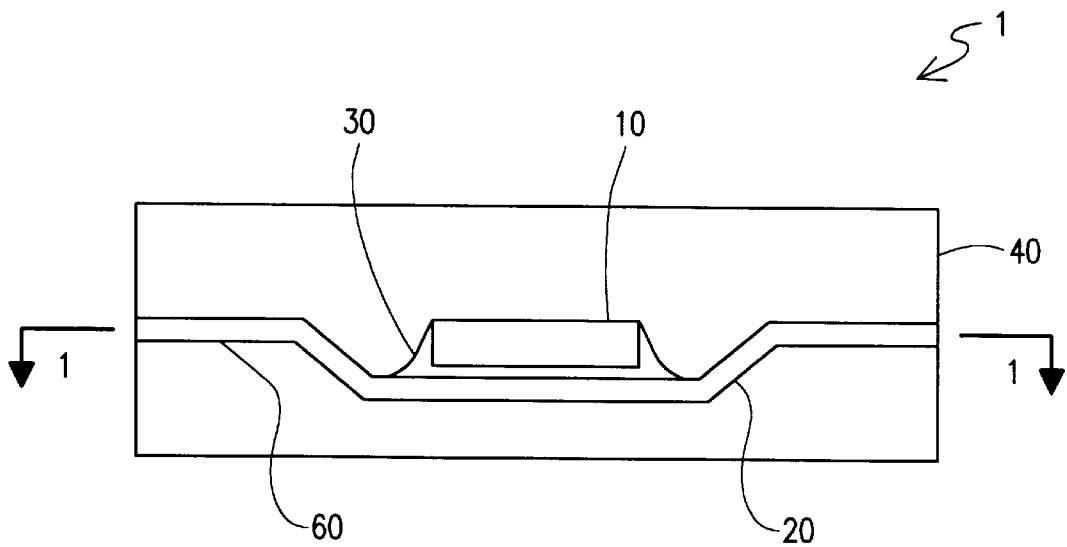
FIG. 2 is a side cross-section view of a plastic encapsulated integrated circuit.

Referring to FIGS. 1 and 2, in the relevant components of a plastic encapsulated integrated circuit package 1 are shown. An integrated circuit die 10 is coupled to a mounting structure 20 by an epoxy adhesive 30. The integrated circuit die 10 and mounting structure 20 are subsequently encapsulated in plastic material 40 through a transfer molding process. Also shown are the contact pins 50. In some plastic encapsulated integrated circuits 1 the mounting structure 20 may be comprised of a metal die paddle. In other plastic encapsulated circuits, the mounting structure 20 may be comprised of a metal layer deposited on a substrate. Other mounting structures may accomplish substantially the same function of attaching an integrated circuit die 10.

In prior art, semiconductor manufacturers tended to minimize the thickness of the epoxy adhesive 30 that bonded the integrated circuit die 10 to the mounting structure 20 for cost saving reasons among others. Through common knowledge of a variety of plastic encapsulated integrated circuits manufactured by companies in the industry, the nominal thickness for the epoxy adhesive 30 was found to be approximately 0.0002 inches (0.2 mils) for epoxy adhesive that was dry and cured. Since the shrinkage factor that effects the epoxy adhesive is approximately 50% during drying and curing, it is estimated that the prior art thickness of the epoxy adhesive 30 was approximately 0.0004 inches (0.4 mils) when it was applied to the mounting structure 20.

At 0.0002 inches and less the epoxy adhesive 30 is so thin that as a practical matter, there is virtual component to component contact as between the integrated circuit die 10 and the mounting structure 20. That is, with an extremely thin epoxy adhesive 30, there is no buffer between the integrated circuit die 10 and mounting structure 20 to absorb the expansion forces of the mounting structure 20 when subject to thermal stress. Thus, the integrated circuit die 10 is subject to the full effect of the mounting structure 20 thermal coefficient of expansion which in turn creates the expansion forces at the interface of the integrated circuit die 10 and mounting structure 20 and promotes fracturing of the integrated circuit die 10.

One technique for reducing fracturing of the integrated circuit die 10 is to increase the thickness of the epoxy adhesive 30. The increased thickness of the epoxy adhesive 30 provides a greater buffer as between the integrated circuit die 10 and the mounting structure 20. The thicker epoxy adhesive 30 tends to absorb the stress of the expansion forces of the mounting structure 20, thereby reducing the propensity for the integrated circuit die 10 to fracture when under the influence of thermal stress.

For Thin and Standard plastic packages, a significant reduction in die cracking was realized when the thickness of the epoxy adhesive 30 was increased to 0.0012–0.003 inches wet (1.2–3.0 mils). After curing and encapsulation, the epoxy adhesive 30 thickness is approximately 0.0005–0.0025 inches (0.5–2.5 mils). The shrinkage factor depends on several parameters particular to the specifics of the curing and encapsulation process.

In the other embodiments, the thickness of the epoxy adhesive 30 may be made proportional to the area of the integrated circuit die 10. Thus, integrated circuit dies 10 with greater area may have an increased thickness of the epoxy adhesive 30 from the ranges described above for the present invention. However, increasing the thickness of the epoxy adhesive 30 to the ranges described by the present invention will provide an improvement over the prior art in reducing die cracking.

Plastic packages are characterized by the ratio of the plastic area to the metal area at the Neutral Bending Axis (NBA) 60 as shown in FIG. 2. The NBA is located at the seam of the package which is created upon encapsulation by the external protrusion of the mounting structure 10 and the pins 50. An ideal plastic to metal ratio for integrated circuit packages such as TSSOP is as follows:

$$A_M \leq A_p \tag{1}$$

However, in practical applications the mounting structure 20 is enlarged to accommodate an integrated circuit die 10 with expanded functions and the plastic material 40 is made small to minimize the size of the package. Thus, in reality $A_M \geq A_p$, the opposite of the ideal, which creates a tensile package characterized by destructive expansion forces at the interface of the integrated circuit die 10 and mounting structure 20 that promote fracturing of the integrated circuit die 10. The Thin and Standard Packages enumerated above have similar characteristics to TSSOP with regard to the ratio of plastic area to metal are at the NBA. Therefore, the present invention is equally applicable to these packaging standards as to TSSOP.

In some embodiments of the invention, the thickness of the epoxy adhesive 30 is uniform across the entire area between the integrated circuit die 10 and the mounting structure 20. In alternative embodiments, the thickness of the epoxy adhesive 30 varies due to grooves, holes, dimples, or other structural modifications of the mounting structure 20 which cause the mounting structure 20 to deviate from a strictly planar geometry in the area adjacent the integrated circuit die 10. In further embodiments, the area of increased thickness of the epoxy adhesive 30 is a significant portion of the area between the integrated circuit die 10 and the mounting structure 20. Increasing the thickness of the epoxy adhesive 30 in only a small portion of the area, for example, proximate a groove in the mounting structure 20, will relieve stresses in the die local to the groove. However, relief of stresses across the entire die requires a thickening of the epoxy across a more significant portion of the area between the die 10 and the mounting structure 20.

A second technique for reducing the fracturing of integrated circuit dies is to reduce the thickness of the integrated circuit die 10. Thinner dies have a greater modulus of elasticity which are defined as:

$$\text{Modulus of Elasticity} = L/(W*h^2) \tag{2}$$

where,

L=die length

W=die width h=die thickness

Thus, as h becomes small, the Modulus of Elasticity becomes greater and the integrated circuit die 10 exhibits greater flexural strength. Increased flexural strength results in a lower propensity for fracturing of the integrated circuit die 10 because the die becomes more resilient to thermal stress and the accompanying expansion forces.

In the prior art, integrated circuit die 10 thickness for Thin Packages typically fell in a range of 0.0105–0.0125 inches (10.5–12.5 mils) with 0.0115 inches (11.5 mils) being the nominal integrated circuit die 10 thickness. For Standard Packages, the integrated circuit die 10 thickness of the prior art fell in a range of 0.015–0.025 inches (15–25 mils) with 0.015 inches (15 mils) being the nominal integrated circuit die 10 thickness. Semiconductor manufacturers preferred thicker integrated circuits dies 10 because thicker dies were less prone to damage during the fabrication process. What has not been fully appreciated in the prior art is that even though thicker dies facilitated handling during assembly, they did so at the cost of sacrificing flexural strength, which is critical for negating thermal stress. Therefore the underlying theory behind the modulus of elasticity, as practiced by the present invention, was never fully realized in the prior art.

By reducing the integrated circuit die 10 thickness to approximately a range of 0.0075–0.0085 inches (7.5–8.5 mils) for Thin Packages and 0.0075–0.012 inches (7.5–12 mils) for Standard Packages a significant reduction in die cracking may be realized. Thus, for TSSOP packages, the reduction in integrated circuit die 10 thickness equates to approximately 28–32%. For Standard Packages, a macro range of 0.0075–0.012 inches (7.5–12 mils) die thickness has two preferred sub-ranges dictated by current fabrication technology. The two sub-ranges are 0.0075–0.0085 inches (7.5–8.5 mils) and 0.010–0.012 inches (10–12 mils). Standard Package die thickness outside of the two sub-ranges, but within the macro range is technically an option, but not preferred with current manufacturing technology.

As shown in FIG. 2, the mounting structure 20 is offset in the form of a well, for having the top surface of the integrated circuit die 10 coplanar with the NBA 60. Having the top surface of the integrated circuit die 10 coplanar with the NBA 60 reduces stress on the integrated circuit die 10. A thinner integrated circuit die 10 allows for a mounting structure 20 allows for reduction in the depth of the offset while maintaining the top surface of the integrated circuit die 10 coplanar with the NBA. A shallower offset in the mounting structure 20 permits a more equal distribution of the plastic encapsulant 40.

Although the invention has been particularly shown and described with reference to a preferred embodiment thereof, it will be understood by those skilled in the art that changes in form and detail may be made therein without departing from the spirit and scope of the invention.

What is claimed is:

1. A method for attaching an integrated circuit die to a mounting structure, the method comprising the steps of:
   applying an adhesive to the mounting structure;
   attaching the integrated circuit die to the adhesive, wherein the integrated circuit die is approximately 0.0075–0.0085 inches thick and a thickness of the epoxy adhesive is approximately 0.0012–0.003 inches after the integrated circuit die is attached to the adhesive; and
   encapsulating the integrated circuit die, the adhesive and the mounting structure in plastic.

2. A method as claimed in claim 1, wherein the thickness of the adhesive is approximately 0.0012–0.003 inches, after the integrated circuit die is attached to the adhesive, across a significant portion of an area between the integrated circuit die and the mounting structure.

3. A method for attaching an integrated circuit die to a mounting structure, comprising the steps of:
   applying an adhesive to the mounting structure;
   attaching the integrated circuit die to the adhesive, wherein a die thickness of the integrated circuit is approximately 0.0075–0.0085 inches;
   encapsulating the integrated circuit die, the adhesive and the mounting structure in plastic; and
   curing the plastic encapsulant, wherein a thickness of the adhesive is approximately 0.0005–0.0025 inches after curing of the adhesive and encapsulation.

4. A method as claimed in claim 3, wherein the thickness of the adhesive is approximately 0.0005–0.0025 inches after curing of the adhesive and encapsulation, across a significant portion of an area between the integrated circuit die and the mounting structure.

5. A method for attaching an integrated circuit die to a mounting structure, comprising the step of applying an adhesive to a mounting structure for coupling an integrated circuit die to the mounting structure wherein a thickness of the adhesive is approximately 0.0012–0.003 inches when applied.

6. A method as claimed in claim 5, wherein the thickness of the adhesive is approximately 0.0012–0.003 inches when applied, across a significant portion of an area between the integrated circuit die and the mounting structure.

7. A method for reducing integrated circuit die cracking, comprising the step of applying an adhesive to a mounting structure for coupling an integrated circuit die to the mounting structure wherein a thickness of the adhesive is approximately 0.0005–0.0025 inches after curing of the adhesive and encapsulation.

8. A method as claimed in claim 7, wherein the thickness of the adhesive is approximately 0.0005–0.0025 inches after curing of the adhesive and encapsulation, across a significant portion of an area between the integrated circuit die and the mounting structure.

9. A plastic encapsulated integrated circuit comprising an integrated circuit die coupled to a mounting structure by means of an adhesive wherein the improvement comprises an increased thickness of the adhesive to approximately 0.0012–0.003 inches when applied.

10. A plastic encapsulated integrated circuit as claimed in claim 9, wherein the thickness of the adhesive is approximately 0.0012–0.003 inches when applied, across a significant portion of an area between the integrated circuit die and the mounting structure.

11. A plastic encapsulated integrated circuit comprising an integrated circuit die coupled to a mounting structure by means of an adhesive wherein the improvement comprises an increased thickness of the adhesive to approximately 0.0005–0.0025 inches after curing the adhesive and encapsulation.

12. A plastic encapsulated integrated circuit as claimed in claim 11, wherein the thickness of the adhesive is approximately 0.0005–0.0025 inches after curing of the adhesive and encapsulation, across a significant portion of an area between the integrated circuit die and the mounting structure.

13. A method for reducing integrated circuit die cracking, comprising the steps of:
   coupling an integrated circuit die to a mounting structure by applying an adhesive to the mounting structure and locating the integrated circuit die on the adhesive; and
   encapsulating the integrated circuit die, the adhesive and the mounting structure in plastic to form a Standard Package;
   wherein a die thickness of the integrated circuit die is approximately 0.0075–0.012 inches and a thickness of the adhesive is approximately 0.0012–0.03 inches when applied.

14. A method for reducing integrated circuit die cracking, comprising the steps of:

coupling an integrated circuit die to a mounting structure by applying an adhesive to the mounting structure and locating the integrated circuit die on the adhesive; and encapsulating the integrated circuit die, the adhesive and the mounting structure in plastic to form a Standard Package;

wherein a die thickness of the integrated circuit die is approximately 0.0075–0.012 inches and a thickness of the adhesive is approximately 0.0005–0.0025 inches after curing of the adhesive and encapsulation.

* * * * *